(12) United States Patent
Tailliet et al.

(10) Patent No.: US 10,013,208 B2
(45) Date of Patent: Jul. 3, 2018

(54) METHOD FOR WRITING IN AN EEPROM MEMORY AND CORRESPONDING MEMORY

(71) Applicant: STMicroelectronics (Rousset) SAS, Rousset (FR)

(72) Inventors: François Tailliet, Fuveau (FR); Marc Battista, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 36 days.

(21) Appl. No.: 15/055,546

(22) Filed: Feb. 27, 2016

(65) Prior Publication Data

US 2017/0039001 A1 Feb. 9, 2017

(30) Foreign Application Priority Data

Aug. 6, 2015 (FR) ...................................... 15 57577

(51) Int. Cl.
| | |
|---|---|
| *G06F 11/10* | (2006.01) |
| *G06F 3/06* | (2006.01) |
| *G11C 16/10* | (2006.01) |
| *G11C 16/34* | (2006.01) |
| *G11C 29/52* | (2006.01) |

(52) U.S. Cl.
CPC ............ *G06F 3/0659* (2013.01); *G06F 3/061* (2013.01); *G06F 3/0652* (2013.01); *G06F 3/0679* (2013.01); *G06F 11/1068* (2013.01); *G11C 16/10* (2013.01); *G11C 16/3495* (2013.01); *G11C 29/52* (2013.01)

(58) Field of Classification Search
CPC ...... G06F 3/0659; G06F 3/0679; G06F 3/061; G06F 3/0652; G06F 11/1068; G11C 29/52; G11C 16/10; G11C 16/3495
USPC ....................................................... 714/763
See application file for complete search history.

(56) References Cited

U.S. PATENT DOCUMENTS

| | | | |
|---|---|---|---|
| 5,777,923 A | 7/1998 | Lee et al. | |
| 6,041,001 A | 3/2000 | Estakhri | |
| 6,854,083 B2 * | 2/2005 | La Rosa | G11C 16/10 |
| | | | 365/189.05 |
| 8,051,358 B2 * | 11/2011 | Radke | G06F 11/1072 |
| | | | 365/185.09 |
| 8,239,735 B2 * | 8/2012 | Shalvi | G11C 16/349 |
| | | | 714/774 |

(Continued)

FOREIGN PATENT DOCUMENTS

JP 2005216455 A 8/2005

*Primary Examiner* — James C Kerveros
(74) *Attorney, Agent, or Firm* — Slater Matsil, LLP

(57) ABSTRACT

According to one mode of implementation it is proposed to automatically accelerate the write operation by deleting on the basis of the values of the data to be written and optionally on the basis of the values of the data present in the memory the erasure step or the programming step, so doing while optionally using a conventional write command. When the memory is equipped with an error-correcting code based on a Hamming code, a property of the latter makes it possible readily to implement this possible acceleration of the cycles of writings within the memory. This property is that according to which when all the bits of the bytes of a digital word grouping together n bytes are equal to zero, the check bits associated with these bytes are also all equal to zero.

23 Claims, 9 Drawing Sheets

(56) References Cited

U.S. PATENT DOCUMENTS

| | | | | |
|---|---|---|---|---|
| 8,261,158 B2 * | 9/2012 | Thatcher | ............... | G11C 16/10 |
| | | | | 714/763 |
| 8,438,453 B2 * | 5/2013 | Post | ................. | G06F 11/1068 |
| | | | | 714/763 |
| 8,595,421 B2 * | 11/2013 | Estakhri | ............... | G06F 3/0616 |
| | | | | 711/103 |
| 8,599,611 B2 * | 12/2013 | Shalvi | ................. | G11C 16/26 |
| | | | | 365/185.02 |
| 8,799,747 B2 * | 8/2014 | Goss | ................ | G06F 11/1068 |
| | | | | 714/746 |
| 8,898,546 B1 * | 11/2014 | Kou | ................. | G06F 11/1012 |
| | | | | 714/719 |
| 8,938,655 B2 * | 1/2015 | Hamilton | .............. | G11C 16/10 |
| | | | | 365/185.01 |
| 2004/0051149 A1 | 3/2004 | Hazama | | |
| 2017/0039001 A1 * | 2/2017 | Tailliet | ................. | G06F 3/061 |

* cited by examiner

METHOD FOR WRITING IN AN EEPROM MEMORY AND CORRESPONDING MEMORY

This application claims priority to French Application No. 1557577, filed on Aug. 6, 2015, which application is hereby incorporated herein by reference.

TECHNICAL FIELD

Embodiments of the present invention relate to a method for writing in an EEPROM memory and a corresponding memory.

BACKGROUND

Currently one aims to produce EEPROM memories having ever higher densities, that is to say ever more sizable memory capacities, for example several megabits.

But this leads to an increase in the data transfer time. When reading, the data transfer time is determined by the transfer of the data read over the bus. When writing, the data transfer time is determined by the transfer over the bus of the data to be written as well as by the duration of the write operation. Consequently, a need exists to reduce this data transfer time.

A solution consists in increasing the frequency of the bus. However, when using a bus of the I$^2$C, type, that is to say with an open drain, the maximum frequency is limited by the speed/consumption compromise. In practice, a value of 1 MHz is currently a maximum value for this type of bus.

For a bus of the SPI type, there is not really any limit for the maximum value of the frequency, but currently a frequency of 20 MHz is the maximum frequency used in applications requiring integrated circuits powered by a 5 V supply.

Generally, an EEPROM memory write operation or cycle requires two steps, namely an erasure step followed by a programming step. In the erasure step, an erasure pulse globally erases (sets to zero) all the memory cells of the bytes to be written. In the programming step, a programming pulse selectively programs (sets to 1) the memory cells which have to store a logical 1.

Each of these pulses is of the order of a millisecond and this duration results from a compromise between the constraints of a method of fabrication capable of providing high voltage (for example 15 or 16 V), the endurance of the memory (for example 4 million cycles) and the breakdown rate of the gate oxide.

Increasing the programming voltage from 16 V to 17 V could make it possible to gain a ratio of typically 10 in the duration of the write operation but at the price of technological constraints and of an endurance reduced by possibly a decade and a rate of breakdown of gate oxides increased by several decades.

Furthermore, such a mode of fast writing has to be activated by a dedicated command ("opcode") and for a limited number of times (in the factory for example).

When a sizable quantity of data has to be written over N pages, a solution can consist in simultaneously erasing these N pages in a single cycle and then sequentially programming all the N pages one by one. However, here again such a mode of programming requires a dedicated command and the user must ensure that the pages concerned are in an "erased" status before receiving such a command since otherwise the new data will be combined with the old data through a logical OR function.

SUMMARY

Modes of implementation and embodiments of the invention relate to electrically programmable and erasable read-only memories termed EEPROM memories, and more particularly the operation of writing a digital word to a memory location of such a memory.

According to one mode of implementation another solution is proposed for reducing the duration and consequently the consumption of an EEPROM memory write cycle or operation and/or for improving the endurance of the memory.

According to one mode of implementation it is proposed to automatically accelerate the write operation and/or to improve the endurance of the memory, by deleting on the basis of the values of the data to be written and/or on the basis of the values of the data present in the memory, the erasure step and/or the programming step, so doing while optionally using a conventional write command and while avoiding any over-programming, accidental or intentional, of the memory cells of the memory plane.

A deletion of a programming step (or a disabling of the programming circuit) is understood here and hereinafter in the text as an absence of generation of the programming pulse (stated otherwise there is no programming step), this being manifested by an acceleration of the write cycle and an improvement of the endurance of the memory) or else as a generation of the programming pulse but without selection of the memory cells concerned, this being manifested by an improvement of the endurance of the memory but without acceleration of the write cycle if the erasure step has remained.

Thus according to an aspect there is proposed a method for writing at least one digital word to at least one memory location of a memory plane of an electrically programmable and erasable read-only memory (EEPROM) device. The method comprises a particular mode of writing implemented within the memory device and comprises a possible deletion of the step of erasure and/or of the step of programming of the write operation or cycle as a function of the former content of the memory location and/or of the new content of the memory location including the digital word to be written.

Indeed, in certain cases, the write operation can comprise only an erasure step or only a programming step or else neither erasure step nor programming step, thereby making it possible to accelerate the write cycle and therefore reduce its consumption and/or to improve the endurance of the memory.

Thus, if for example the word to be written contains only "0"s, then only an erasure step is necessary.

If moreover the former content of the memory location in which one wishes to write only "0"s already contained only "0"s, then the erasure step can also be skipped.

Likewise, when for example the word 0F (in hexadecimal notation) has to be replaced with the word 1F, or else if the former content of the memory location in which one wishes to write a digital word already contains only "0"s, then the erasure step is irrelevant.

More generally, according to one mode of implementation, this particular mode of writing comprises a deletion of the erasure step if the new content of the memory location is bitwise greater than or equal to the former content of this memory location, the former content being assumed to be error-free.

The former content can be assumed error-free (that is to say no bit of this former content is considered to be unreliable) for example having regard to the conditions of use of the memory or else because this former content has been verified and optionally corrected by an error-correcting code mechanism if the memory is equipped therewith.

If the new content of the memory location is bitwise equal to the former content of this memory location, then this particular mode of writing also comprises a deletion of the programming step.

Furthermore if the new content of the memory location is bitwise greater than or equal to the former content and if at least one bit of the new content is greater than the corresponding bit of the assumed error-free former content, then the particular mode comprises only a programming of each bit of the new content greater than the corresponding bit of the former content.

Any risk of accidental or intentional over-programming of the corresponding memory cell or cells is thus avoided.

A particularly simple way of implementing selective programming such as this is to command the programming of each bit for which the result of a logical AND function applied to the new value of this bit and to the opposite of the old value of this bit is equal to 1.

This particular mode of writing is implemented in a manner internal to the memory device. In other words, it is the memory device itself which detects the values of the data to be written and/or the values of the data present in the memory, and which decides for the write cycle considered, on the basis of the values of the data to be written and/or on the basis of the values of the data present in the memory, to delete at least one of the erasure or programming steps or else to keep the conventional succession of erasure step/programming step.

This decision can be easily implemented by simple combinatorial logic.

Stated otherwise it is not an element external to the memory device, for example, the microcontroller which delivers the write command, which will decide to command these possible deletions of steps in view for example of an analysis, made by this external element, of the values of the data to be written and/or of the values of the data present in the memory.

Thus when this particular mode of writing is implemented and activated in the memory, the user of the memory does not have control over making a decision to accelerate one or more write cycles, thereby making it possible in particular as indicated hereinabove to avoid any over-programming, accidental or intentional, of the memory cells of the memory plane.

All this is particularly beneficial in particular for EEPROM memories of large capacity. Such memories generally use an error-correcting code mechanism (ECC: "Error Code Correction"). The particular mode of writing mentioned hereinabove can apply to a memory equipped with an error-correcting code mechanism, whatever this code.

That being so, when the error-correcting code is based on a Hamming code, a property of the latter makes it possible readily to implement a possible acceleration of the write cycles and/or an improvement of the endurance within the memory device.

This property is that according to which when all the bits of the bytes of a digital word grouping together n bytes are equal to zero, the check bits (also sometimes called "parity bits" or "error correction bits") associated with these bytes are also all equal to zero.

A person skilled in the art is aware of the characteristics and properties of Hamming codes. It is nonetheless recalled here for all useful purposes that a Hamming code is a linear corrector code, so-called "perfect" (that is to say that for a given code length there does not exist any other more compact code having the same correction capacity) and of minimum distance (Hamming distance) equal to three.

Thus according to another aspect there is proposed a method for writing at least one digital word to at least one memory location of a memory plane of an electrically programmable and erasable read-only memory device comprising a Hamming code type error-correcting code mechanism, the digital word comprising at least one data byte and the memory location being intended to contain a number of data bytes at least equal to the number of data bytes of the digital word together with check bits.

Conventionally the memory plane of the memory device comprises memory cells connected to row selection lines and to bit lines.

The bit lines are grouped into columns comprising for example M bit lines.

The memory cells connected to one and the same selection line form a word line and a memory location or memory word comprises for example the memory cells of one and the same word line connected to the M bit lines of a column. Such a memory location makes it possible for example to store a digital word of 32 data bits (4 bytes) and 6 check bits.

The method according to a variant of this aspect comprises a first mode of writing implemented within the memory device and comprising in response to a command to write the digital word, a reading of the current content of the memory location, a calculation of new check bits associated with the data of the new content of the memory location, and a writing of the new content of the memory location including the digital word and the new check bits by a programming step with no prior erasure step if all the bits of the current content read are set to 0, or through a conventional succession of an erasure step and of a programming step if at least one bit of the current content read is set to 1.

Thus the simple reading of the bits of the current content makes it possible to detect whether the current content of the memory location, that is to say the data present in this memory location before the writing, consists only of bits equal to 0.

And, if the current content of the memory location consists only of bits equal to 0, the command to write the digital word will trigger the writing of the new content including the digital word using only a programming step with no prior erasure step thereby making it possible to reduce the duration of the write operation or cycle.

This would not have been readily possible, or indeed impossible, if use had been made of an error-correcting code (different from the Hamming code) for which data bits all equal to 0 lead to check bits not all equal to 0. Indeed in such a case it would be necessary for the new check bits of the new content of the memory location to have "1"s situated at the same places as those of the check bits of the former content, since a programming is capable only of changing a "0" into a "1".

It should be noted here that when the memory location is capable of storing more than one byte, this step of reading the current content of the memory location is already implemented and does not therefore need to be added into the method according to this aspect.

The method according to another variant of this aspect comprises a second mode of writing implemented within the memory device and comprising in response to a command to write the digital word, a calculation of new check bits associated with the data of the new content of the memory location, and a writing of the new content of the memory location including the digital word and the new check bits by an erasure step with no posterior programming step if all the data bits of the new content are set to 0, or through a conventional succession of an erasure step and of a programming step if at least one bit of the new content is set to 1.

Although it is possible, especially with an aim of simplifying the memory state machine, it is however not necessary to test whether the new check bits are set to 0, since having regard to the particular nature of the Hamming code, if all the data bits of the new content are set to 0, then the new check bits calculated will be set to 0.

Thus, according to this other variant, if all the bits of the future content of the memory location are set to 0, the programming step is irrelevant and it is therefore possible here again to reduce the duration of the write cycle and/or improve the endurance.

It should be noted here that the triggering of the write operation with no programming step is not conditioned upon the current content of the memory location, that is to say the previous data present in this memory location before the writing, since the erasure step is a global step for all the bits of this memory location.

The reading of the current content of the memory location is not necessary in this other variant when the digital word contains only a single byte and is associated with 4 check bits.

On the other hand when the digital word comprises several data bytes, the second mode of writing furthermore comprises prior to the calculation of the new check bits a reading of the current content of the memory location.

The first mode of writing and the second mode of writing can of course both be implemented within the memory device.

The method according to yet another variant of this aspect comprises a third mode of writing implemented within the memory device and comprising in response to a command to write the digital word, a reading of the current content of the memory location, and an absence of erasure step and of programming step if all the bits of the current content read are set to 0 and if all the data bits of the new content, including the digital word, are set to 0.

Stated otherwise, according to this other variant which is optional, if the current content and the new content of the memory location contain only 0s, the write cycle comprises neither erasure step nor programming step.

The first mode of writing, the second mode of writing and the third mode of writing can also all three be implemented within the memory device.

When the memory is intended to be written page-wise, there is proposed according to another aspect a method for writing several digital words in several memory locations of a memory plane of an electrically programmable and erasable read-only memory device comprising a Hamming code type error-correcting code mechanism, the several memory locations forming at least one page of the memory plane, each digital word comprising at least one data byte and each memory location being intended to contain a number of data bytes at least equal to the number of data bytes of the digital word together with check bits.

According to a variant of this other aspect, the method comprises a first mode of page writing implemented within the memory device and comprising in response to a command to write the digital words of the page, a reading of the current content of each memory location, a calculation of new check bits associated with the data of the new content of each memory location, and a writing of the new content of each memory location including the corresponding digital word and the new corresponding check bits by a programming step with no prior erasure step if all the bits of each current content read are set to 0, or through a conventional succession of an erasure step and of a programming step if at least one bit of at least one current content read is set to 1.

According to another variant of this other aspect, also applicable to writing in page mode, the method comprises a second mode of page writing implemented within the memory device and comprising in response to a command to write the digital words of the page, a calculation of new check bits associated with the data of the new content of each memory location, and a writing of the new content of each memory location including the corresponding digital word and the new corresponding check bits by an erasure step with no posterior programming step if all the data bits of each new content are set to 0, or through a conventional succession of an erasure step and of a programming step if at least one bit of at least one new content is set to 1.

Here again, when each digital word comprises several data bytes the second mode of page writing further comprises, prior to each calculation of the new check bits, a reading of the current content of each memory location.

The first mode of page writing and the second mode of page writing can both be implemented, and in this case the writing of the digital words of the page requires a conventional succession of an erasure step and of a programming step if the respective writings of at least two digital words require different types of steps (for example, one digital word requires only an erasure step while another word requires only a programming step) or if the writing of at least one digital word requires a succession of an erasure step and of a programming step.

According to yet another variant of this other aspect, the method comprises a third mode of page writing implemented within the memory device and comprising in response to a command to write the digital words of the page, a reading of the current content of each memory location, and an absence of erasure step and of programming step if all the bits of each current content read are set to 0 and if all the data bits of each new content including the corresponding digital word are set to 0.

The first mode of page writing, the second mode of page writing and the third mode of page writing can be combined, and the writing of the digital words of the page requires only an erasure step if the writing of at least one digital word requires only an erasure step and if the writing of no other digital word requires a programming step, requires only a programming step if the writing of at least one digital word requires only a programming step and if the writing of no other digital word requires an erasure step, and requires a conventional succession of an erasure step and of a programming step in all other cases.

Just like the particular mode of writing mentioned hereinabove, each of the three modes of writing and each of the three modes of page writing which have just been mentioned in respect of memories equipped with error-correcting code of the Hamming type, is implemented in a manner internal to the memory device with, especially, the same advantages as those mentioned for the particular mode of writing.

The write command triggering the first mode of writing and/or the second mode of writing and/or the third mode of writing and/or the first mode of page writing and/or the second mode of page writing and/or the third mode of page writing can be a conventional write command or else a specific command.

The first mode of writing and/or the second mode of writing and/or the third mode of writing and/or the first mode of page writing and/or the second mode of page writing and/or the third mode of page writing can be implemented by default within the memory device, or else be activatable.

Several non-limiting possibilities exist for undertaking this activation.

It is for example possible to use a volatile or non-volatile bit, programmable by the user, for example a bit of the status word present in the status register of the memory.

It is also possible to use a new specific write command.

According to another aspect there is proposed a memory device of the electrically programmable and erasable read-only memory type, comprising a memory plane containing memory locations, and erase circuit configured to erase the content of a memory location, programming circuit configured to program at least one digital word in a memory location and a driver configured to, in response to a command to write the digital word, optionally disable the erase circuit and/or the programming circuit as a function of the former content of the memory location and/or of the new content of the memory location including the digital word to be written.

According to one embodiment, the driver is configured to disable the erase circuit if the new content is bitwise greater than or equal to the former content, the former content being assumed to be error-free.

According to one embodiment, if the new content of the memory location is bitwise equal to the former content of this memory location, the driver is also configured to disable the programming circuit.

According to one embodiment, if the new content of the memory location is bitwise greater than or equal to the former content and if at least one bit of the new content is greater than the corresponding bit of the assumed error-free former content, the driver is configured to activate the programming circuit so as to perform only a programming of each bit of the new content greater than the corresponding bit of the former content.

According to one embodiment the driver is configured to command the programming of each bit for which the result of a logical AND function applied to the new value of this bit and to the opposite of the old value of this bit is equal to 1.

According to another aspect applicable especially to EEPROM memories equipped with error-correcting codes, there is proposed a memory device of the electrically programmable and erasable read-only memory type. The memory device includes a memory plane containing memory locations, a Hamming code type error-correcting code mechanism, the erase circuit configured to erase the content of a memory location, a read circuit, and a programming circuit configured to program at least one digital word comprising at least one byte in a memory location. The memory location is intended to contain a number of data bytes at least equal to the number of data bytes of the digital word together with check bits.

According to a variant of this other aspect, the device furthermore comprises first a controller configured to, in response to a command to write the digital word, to activate the read circuit to read the current content of the memory location, to activate the error-correcting code mechanism to calculate new check bits associated with the data of the new content of the memory location, and to activate only the programming circuit if all the bits of the current content read are set to 0 or successively activate the erase circuit and the programming circuit if at least one bit of the current content read is set to 1, so as to write the new content of the memory location including the digital word and the new check bits.

According to another variant of this other aspect the memory device comprises a second controller configured to, in response to a command to write the digital word, to activate the error-correcting code mechanism to calculate new check bits associated with the data of the new content of the memory location and to activate only the erase circuit if all the data bits of the new content are set to 0 or successively activate the erase circuit and the programming circuit if at least one bit of the new content is set to 1, so as to write the new content of the memory location including the digital word and the new check bits.

According to one embodiment, when the digital word comprises several data bytes, the second controller is furthermore configured to activate, prior to the activation of the error-correcting code mechanism, the read circuit to read the current content of the memory location.

The device can comprise separate first and second controllers or a single controller that performs both functions or more than two controllers for the same purpose, generally referred to as control circuitry.

According to yet another variant of this other aspect, the memory device comprises a third controller configured to, in response to a command to write the digital word, to activate the read circuit to read the current content of the memory location, and to activate neither the erase circuit nor the programming circuit if all the bits of the current content read are set to 0 and if all the data bits of the new content including the digital word are set to 0.

The device can comprise separate first, second and third control circuits or fewer or more controllers that perform the specified functions, generally referred to as control circuitry.

According to yet another aspect, applicable to a memory intended to be written page-wise, there is proposed a memory device of the electrically programmable and erasable read-only memory type. The memory device comprises a memory plane containing at least one page containing several memory locations, a Hamming code type error-correcting code mechanism, and erase circuit configured to erase the content of a page, a read circuit, and a programming circuit configured to program several digital words in the memory locations of the page. Each digital word comprises at least one byte, the corresponding memory location being intended to contain a number of data bytes at least equal to the number of data bytes of the digital word together with check bits. The memory device also includes a fourth controller configured to, in response to a command to write the digital words to activate the read circuit to read the current content of each memory location, to activate the error-correcting code mechanism to calculate new check bits associated with the data of the new content of each memory location, and to activate only the programming circuit if all the bits of each current content read are set to 0 or successively activate the array circuit and the programming circuit if at least one bit of at least one current content read is set to 1, so as to write the new content of each memory location including the corresponding digital word and the new corresponding check bits.

According to a variant of this other aspect, the device comprises a fifth controller configured to, in response to a command to write the digital words, to activate the error-correcting code mechanism to calculate new check bits associated with the data of each new content of the memory location and to activate only the array circuit if all the data bits of each new content are set to 0 or successively activate the array circuit and the programming circuit if at least one bit of each new content is set to 1, so as to write the new content of each memory location including the corresponding digital word and the new corresponding check bits.

According to one embodiment each digital word comprises several data bytes and the fifth controller is further configured to activate, prior to the activation of the error-correcting code mechanism, the read circuit to read the current content of each memory location.

According to one embodiment, the device includes control circuitry incorporating the fourth and fifth controllers, and configured to control the writing of the digital words of the page through a conventional succession of an erasure step and of a programming step if the respective writings of at least two digital words require different types of steps.

According to yet another variant of this other aspect, the device comprises a sixth controller configured to, in response to a command to write the digital words, to activate the read circuit to read the current content of each memory location, and to activate neither of the erase circuit nor the programming circuit if all the bits of each current content read are set to 0 and if all the data bits of each new content including the corresponding digital word are set to 0.

Control circuitry can incorporate the fourth, fifth and sixth control circuitry, and be configured to control the writing of the digital words of the page only by an erasure step if the writing of at least one digital word requires only an erasure step and if the writing of no other digital word requires a programming step, only by a programming step if the writing of at least one digital word requires only a programming step and if the writing of no other digital word requires an erasure step, and by a conventional succession of an erasure step and of a programming step in all other cases.

According to one embodiment the driver and/or the first control circuitry and/or the second control circuitry and/or the third control circuitry and/or the fourth control circuitry and/or the fifth control circuitry and/or the sixth control circuitry are activatable.

BRIEF DESCRIPTION OF THE DRAWINGS

Other advantages and characteristics of the invention will become apparent on examining the detailed description of wholly non-limiting modes of implementation and embodiments, and the appended drawings in which.

DETAILED DESCRIPTION OF ILLUSTRATIVE EMBODIMENTS

Figure 1:
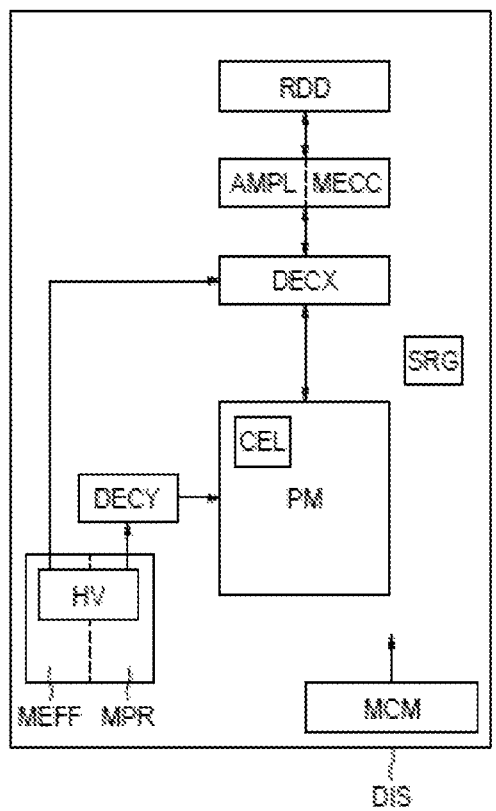
FIGS. 1 to 11, essentially schematic, deal with various modes of implementation and embodiments of the invention.

In FIG. 1, the reference DIS designates an exemplary memory device of EEPROM type according to the invention.

This device DIS comprises a memory plane PM of memory cells CEL, as well as conventional circuit for programming MPR and of erasure MEFF comprising especially high voltage circuitry HV making it possible to apply a high programming or erasure voltage, line and column decoders DECX and DECY as well as a read circuit comprising reading amplifiers AMPL linked to a data register RDD.

The device DIS also comprises in this exemplary embodiment ECC circuitry MECC forming a Hamming code type error-correcting code mechanism, of conventional structure known per se.

The device DIS also comprises control circuitry comprising, for example, logic circuitry of conventional structure capable of activating the programming circuitry MPR, the array circuitry MEFF, the read circuitry AMPL as well as the error-correcting code mechanism MECC.

The memory device DIS also comprises here a status register SRG. This register is however optional, generally present for a memory connected to an SPI bus and in particular non-existent for a memory connected to an I²C bus.

Other conventional circuitry present in the memory device DIS and which are not indispensable to the understanding of the invention, such as for example the address shift register, have intentionally not been represented in FIG. 1 for the sake of simplification.

It is recalled here that a memory cell CEL of the EEPROM type comprises a transistor possessing in a conventional manner a control gate, a floating gate, a drain region and a source region.

Such a cell is erasable and programmable through the Fowler-Nordheim effect.

Conventionally the operation or cycle for writing a data item in such a cell of EEPROM type comprises an erasure step preceding a programming step.

In the erasure step, the array circuit MEFF is configured to couple the drain and the source of the transistor to ground and to apply a control voltage having an erasure value, typically of the order of 15 volts, to the control gate.

In the cell programming step, the programming circuit MPR is configured to link the control gate to ground and to apply a programming voltage on the drain, typically also of the order of 15 volts. As regards the source, the programming circuit MPR is configured to either leave the source floating or precharge it to a non-zero precharge voltage.

Figure 2:
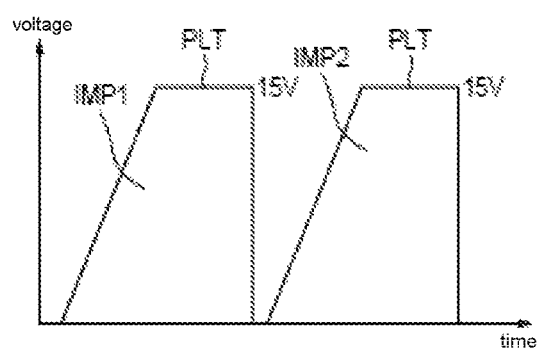

More precisely the array circuit is configured to apply the control voltage on the control gate in the form of an erasure pulse IMP1 while the programming circuit is configured to apply the programming voltage on the drain in the form of a programming pulse IMP2 (FIG. 2).

Each voltage/time erasure or programming pulse exhibits a trapezoidal shape having a ramp followed by a plateau PLT, typically at the nominal level of 15 volts.

The voltage ramp drives the tunnel current of the cell. The ramp and the plateau have nearly identical durations.

As indicated hereinabove, the array circuit MEFF and programming circuit MPR comprise the high voltage circuitry HV for generating the high voltage allowing the generation of the corresponding erasure pulse and programming pulse.

The high voltage circuitry HV conventionally comprises, for example, one or more charge pump stages associated with regulation of charge pumps comprising, for example, an oscillator.

Regulation makes it possible to drive the output voltage of the charge pump. The oscillator is halted when the output of the charge pump exceeds a high reference. The output voltage of the charge pump then begins to decrease because of the charge. As soon as the output voltage of the charge pump is less than a low reference, the oscillator restarts. The voltage gap between the low and high references (hysteresis) ensures stability. This voltage difference is for example of the order of 100 millivolts.

The charge pump regulation level is for example the voltage level of the plateau PLT, for example 15 volts. The charge ramp is for example generated by an analogue integrator which receives the plateau voltage as input.

The duration of the pulse (ramp+plateau) can be controlled by an analogue or digital chronometer ("timer").

By way of indication, a digital chronometer can comprise a fixed frequency oscillator connected to a counter. The counter starts when the charge pump starts and the end of the counting marks the end of the pulse.

As indicated hereinabove, in the erasure step, the erasure pulse globally erases (sets to zero) all the memory cells of the bytes to be written.

In the programming step, the programming pulse selectively programs (sets to 1) the memory cells which have to store a logical 1.

Whereas the write operation generally comprises an erasure step followed by a programming step, it is possible, in certain cases, for a single erasure or programming step to be necessary to write a word in the memory.

Thus, if the word to be written contains only "0"s, then only an erasure step is necessary.

If moreover the memory cells in which one wishes to write only "0"s already contained only "0"s, then the erasure step can also be deleted.

Likewise, by way of non-limiting example, when the word 0F (in hexadecimal notation) has to be replaced with the word 1F, the erasure step is irrelevant.

Thus according to an aspect there is proposed a method for writing at least one digital word to at least one memory location of a memory plane of an electrically programmable and erasable read-only memory (EEPROM) device. The method comprises a particular mode of writing implemented within the memory device and comprising a possible deletion of the step of erasure and/or of the step of programming of the write operation or cycle as a function of the former content of the memory location and/or of the new content of the memory location including the digital word to be written.

And this particular mode of writing is implemented in a manner internal to the memory device, that is to say that it is the memory device itself which detects the values of the data to be written and/or the values of the data present in the memory, and which decides for the write cycle considered, on the basis of the values of the data to be written and/or on the basis of the values of the data present in the memory, to delete at least one of the erasure or programming steps or else to keep the conventional succession of erasure step/ programming step.

This decision can be easily implemented by simple combinatorial logic forming a driver within the control circuitry MCM.

Figure 3:
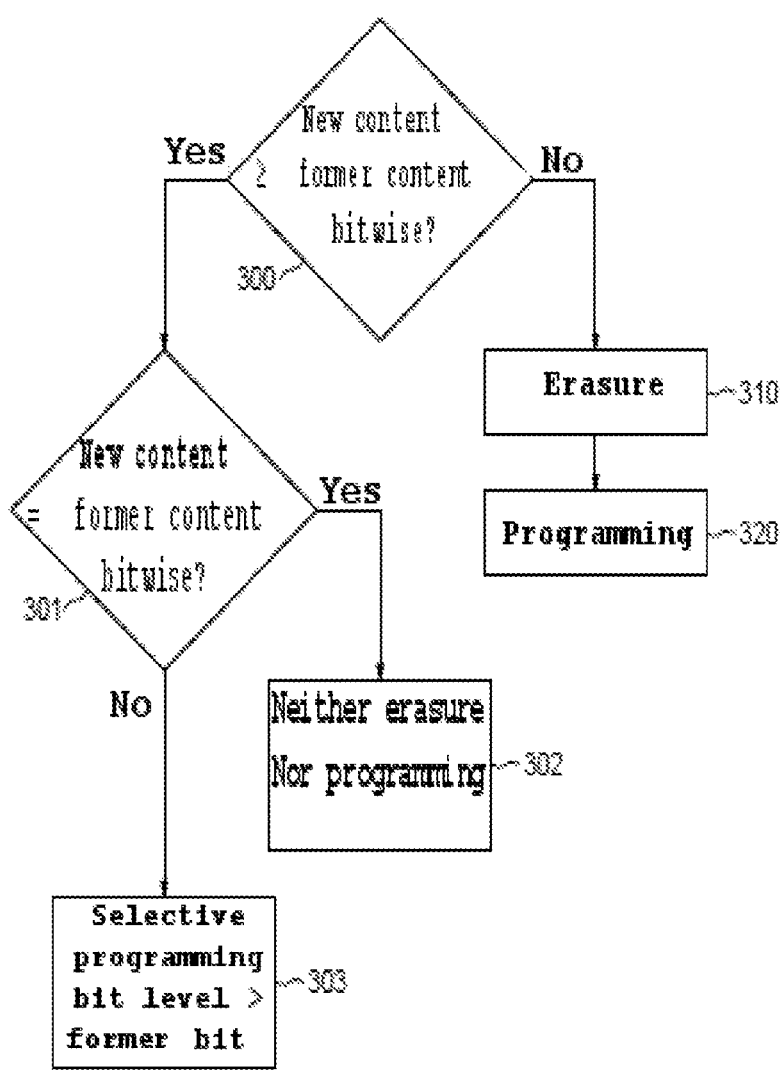

More precisely, according to one mode of implementation illustrated in FIG. 3, the driver test in step 300 whether the new content of the memory location is bitwise greater than or equal to the former content of this memory location, the former content being assumed to be error-free.

In the negative, the driver commands the writing of the new content by successively activating (steps 310 and 320) the array circuit and the programming circuit.

In the affirmative, this particular mode of writing comprises a deletion of the erasure step if the new content of the memory location is bitwise greater than or equal to the former content of this memory location, the former content being assumed to be error-free.

The driver also tests, in step 301, whether the new content of the memory location is bitwise equal to the former content of this memory location.

If such is the case this particular mode of writing also comprises a deletion of the programming step. Stated otherwise there is then neither erasure nor programming (step 302) it being understood that a disabling of the programming step is understood as a non-generation of the programming pulse or else as a generation of this programming pulse but without selection of memory cells (without selection of bit lines).

Furthermore, if the new content of the memory location is bitwise greater than or equal to the former content and if at least one bit of the new content is greater than the corresponding bit of the assumed error-free former content, then the particular mode comprises only a programming of each bit of the new content greater than the corresponding bit of the former content.

Any risk of accidental or intentional over-programming of the corresponding memory cell or cells (step 303) is thus avoided.

Figure 4:
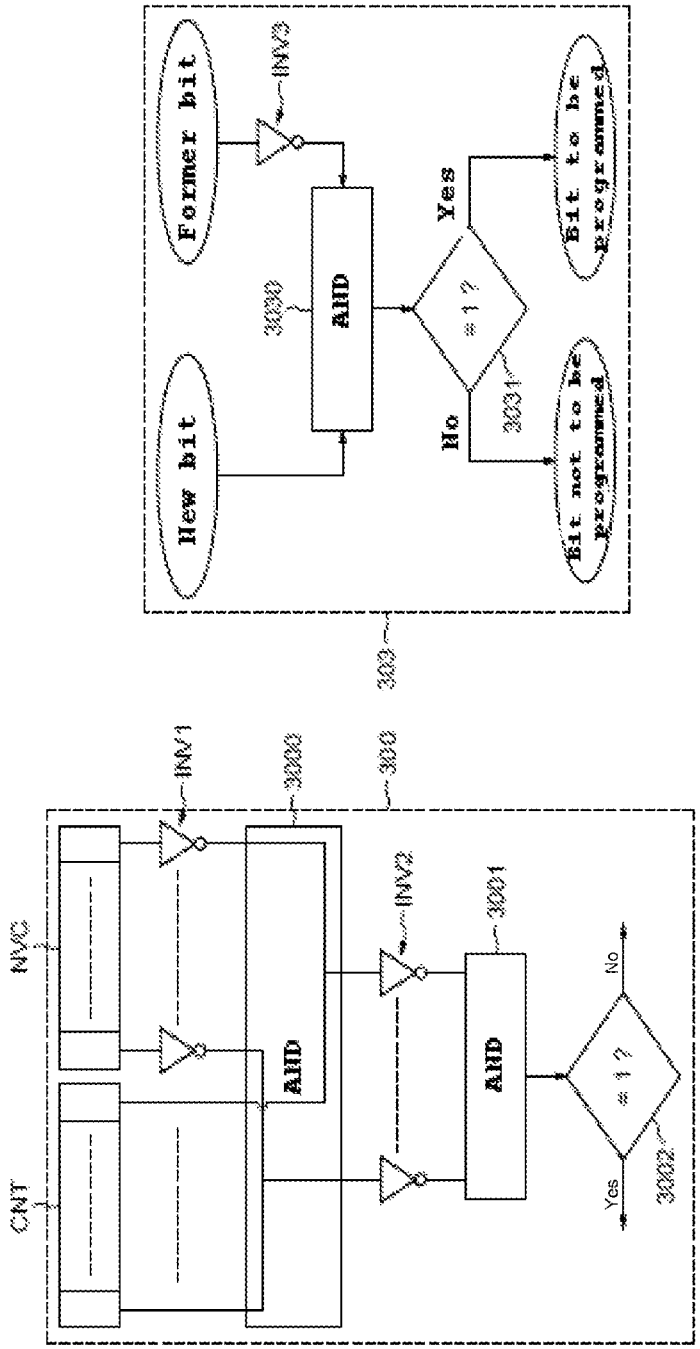

A particularly simple way of implementing the test of step 300 is illustrated in the left part of FIG. 4.

More precisely, a logical AND function is applied (step 3000) to the value of each bit of the former content CNT and to the opposite value (delineated by the inverters INV1) of each homologous bit of the new content NVC.

Next, a logical AND function is applied (step 3001) to the outputs inverted by the inverters INV2 of the AND function.

A test is performed thereafter (step 3002) as to whether the output of the AND function is set to 1.

In the affirmative the new content of the memory location is bitwise greater than or equal to the former content.

This is not the case in the negative.

A particularly simple way of implementing selective programming such as this is, as illustrated in the right part of FIG. 4, to test (step 3031) for each bit whether the result of a logical AND function 3030 applied to the new value of this bit and to the opposite (delineated by the inverter INV3) of the old value of this bit is equal to 1.

In the affirmative this bit will have to be programmed since a 1 will replace a 0 (the new bit will be greater than the former bit).

In the negative this bit will not have to be programmed.

As will now be described in greater detail, the invention is particularly beneficial in respect of EEPROM memories equipped with a Hamming code type error-correcting code mechanism MECC, in particular memories of large capacity.

Non-volatile memories, especially of EEPROM type, are prone to corruptions of data due to defective memory locations or memory cells commonly referred to by a person skilled in the art as "single bit fails".

These defects may be present initially on "pristine" memories or else be absent initially but generated in the course of time during the life of the item.

These defects may be due for example to shortcomings in the fabrication method, to breakdowns of oxides, to occurrences of retention losses on insulated memory cells.

These defective memory locations lead, when reading the bits contained in these locations, to erroneous logic values.

A conventional solution consists in using an error-correcting code or ECC ("Error code correction") to correct the erroneous logic value of a bit. More precisely, with an error-correcting code, if s check bits (or parity bits) are appended to b data bits, it is possible to correct r errors among the b+s bits.

Generally the error-correcting codes used in the field of memories make it possible to correct a single error (r=1) in the word of b+s bits. Two errors in a memory can be corrected on condition that the two defective locations correspond to two bits not situated in the same group of (b+s) bits.

More precisely, as is conventional and known, the ECC circuitry MECC makes it possible, when reading a word in the memory, to determine a syndrome on the basis of the data bits b and of the set of check bits s.

It is recalled here that a syndrome is the result of intermediate calculations performed during error correction, making it possible to detect and to locate the error.

Conversely, the ECC circuitry MECC is also capable of calculating a set of check bits on the basis of a set of data bits.

Conventionally the memory plane of the memory comprises memory cells CEL connected to row selection lines and to bit lines.

The bit lines are grouped into columns comprising for example M bit lines.

M may be for example equal to 38, thus corresponding to words of b useful bits (b=32 corresponding to n=4 bytes) accompanied by s (s=6) error-correcting code bits or parity bits.

The memory cells connected to one and the same selection line form a word line and the memory cells of one and the same word line connected to the M bit lines of a column form a memory location or memory word making it possible to store a digital word of 32 bits and 6 parity bits.

EEPROM memories can be organized by pages (a page comprising all the memory words of one and the same word line).

The quantity of data that can be written in a write cycle can vary from a word to a complete page.

In an EEPROM memory architecture equipped with an error-correcting code mechanism, each time that one wishes to write for example p new bytes to a memory location containing n bytes (with n greater than one and p greater than or equal to one and less than or equal to n) and s check bits, the current content of the memory location, that is to say here the 38 bits of this memory location, is read.

An error correction is optionally performed by the error-correcting code mechanism MECC.

Therefore the values of the bits of the 4 current (initial) bytes are known.

Moreover new check bits are recalculated on the basis of the p new bytes and of the other n-p initial bytes.

Here use is made of the property of an error-correcting code of Hamming code type according to which when the bits of the bytes of a memory location grouping together n bytes are all equal to 0, then the check bits contained in this memory location are all equal to 0.

Thus in the example described here, when the 32 bits of the 4 bytes contained in the memory location of 38 bits are all equal to 0, the check bits and therefore the 38 bits of the memory location are all equal to 0.

FIGS. 5 to 8 apply to memory location by memory location writing of the memory, and not to page-wise writing.

Figure 5:
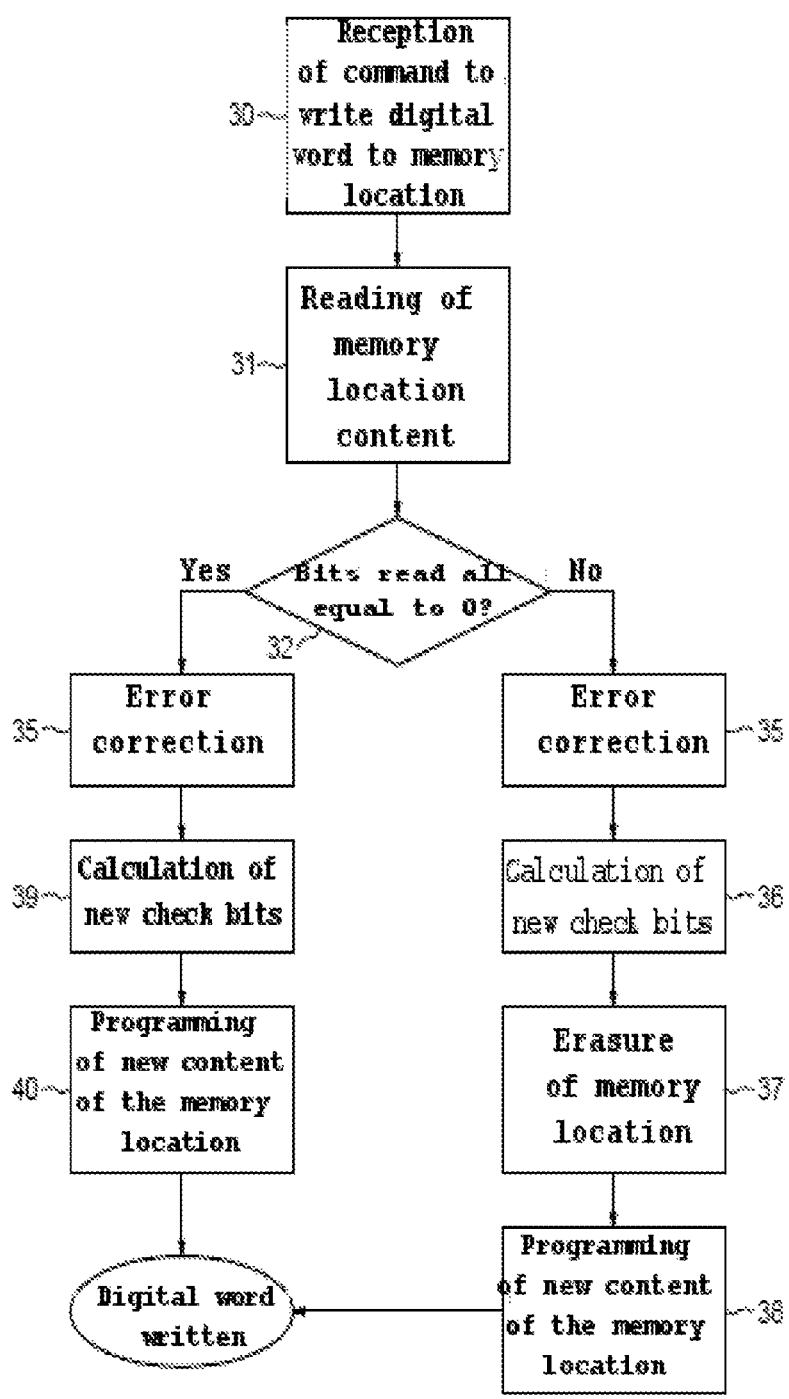

It is possible to define, as illustrated in FIG. 5, a first mode of writing, in which in response to a command to write a digital word to a memory location (step 30), the read circuit performs a reading 31 of the current content of the corresponding memory location (the 38 bits) including the 6 check bits.

The control circuitry MCM then test, for example with the aid of combinatorial logic and/or a comparator, whether all the bits read are set to 0 (step 32).

If at least one bit read is set to 1, the controller activates the ECC circuitry MECC a first time (step 35) so as to correct (if appropriate) the initial content of the memory location, activates the ECC circuitry MECC a second time so as to calculate the new check bits (step 36) and then successively activates the erase circuit MEFF and the programming circuit MPR in such a way as to undertake a writing of the new content of the memory location including the digital word through a conventional succession of an erasure step 37 and of a programming step 38.

If the response to the test 32 is positive, the controller can re-execute step 35 in such a way as to activate the ECC circuitry MECC a first time, activate the ECC circuitry MECC a second time so as to calculate the new check bits (step 39) and then only the programming circuit MPR in such a way as to undertake a writing of the new content of the memory location including the digital word by a programming step 40 with no prior erasure step since it is irrelevant as all the bits of the memory location are already set to 0.

It should be noted that step 35 performed in the left branch of FIG. 5 is optional since all the bits read set to 0 correspond in the Hamming code to no error in the bits.

That being so, executing this step 35 makes it possible to simplify the architecture of the state machine incorporated into the control circuit.

It would also be possible to execute step 35 between steps 31 and 32.

Figure 6:
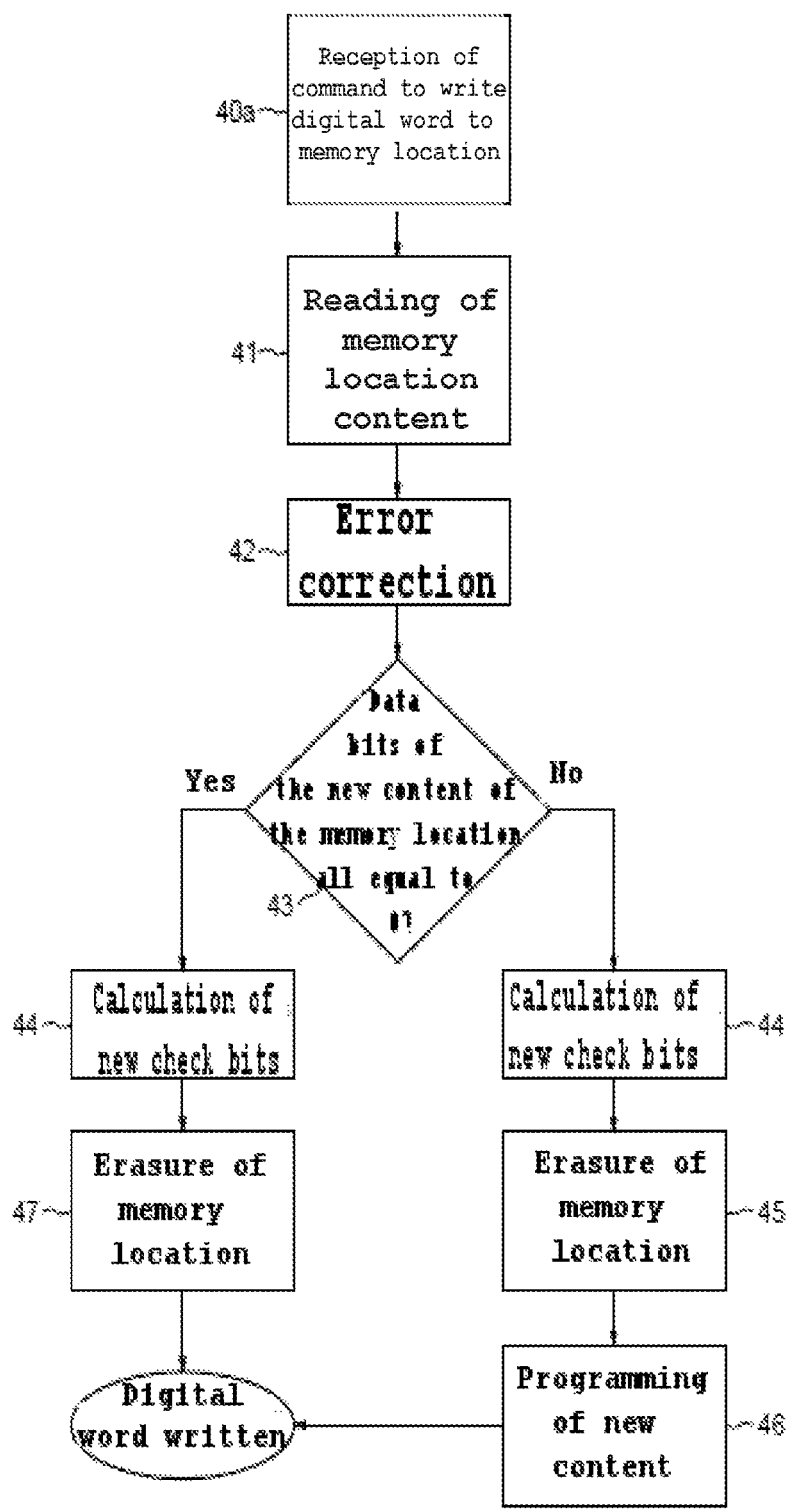

It is also possible to define, as illustrated in FIG. 6, a second mode of writing in which, in response to a command to write a digital word to a memory location (step 40a), the read circuit performs a reading 41 of the current content of the memory location (the 38 bits of the memory location) including the 6 check bits.

Next, the error-correcting code mechanism MECC corrects (if appropriate) the initial content of the memory location.

The control circuitry MCM then tests, for example with the aid of a comparator, whether all the data bits of the new content of the memory location are set to 0 (step 43).

Having regard to the particular nature of the Hamming code, if all the data bits of the new content are set to 0, then the new calculated check bits will be set to 0.

If at least one data bit of the new content is set to 1, the control circuitry MCM activate the error-correcting code mechanism MECC to perform a calculation 44 of the new check bits associated with the new envisaged content of the memory location and then successively activate the erase circuit MEFF and the programming circuit MPR in such a way as to undertake a writing of the new content in the memory location including the digital word through a conventional succession of an erasure step 45 and of a programming step 46.

If the response to the test 43 is positive, the control circuitry MCM can re-execute step 44 of calculating the new check bits associated with the new envisaged content of the memory location.

Here again this re-execution, although preferable for a simplification of the state machine, is optional since in this case the new check bits are set to 0.

As a variant step 44 could be performed between steps 42 and 43.

The controller there after activates only the erase circuit MEFF so as to undertake a writing of this new content including the digital word through an erasure step 47 with no posterior programming step since it is irrelevant as all the bits to be written are set to 0.

Whereas only one of these two modes of writing can be available in the memory device, these two modes can be available together.

Figure 7:
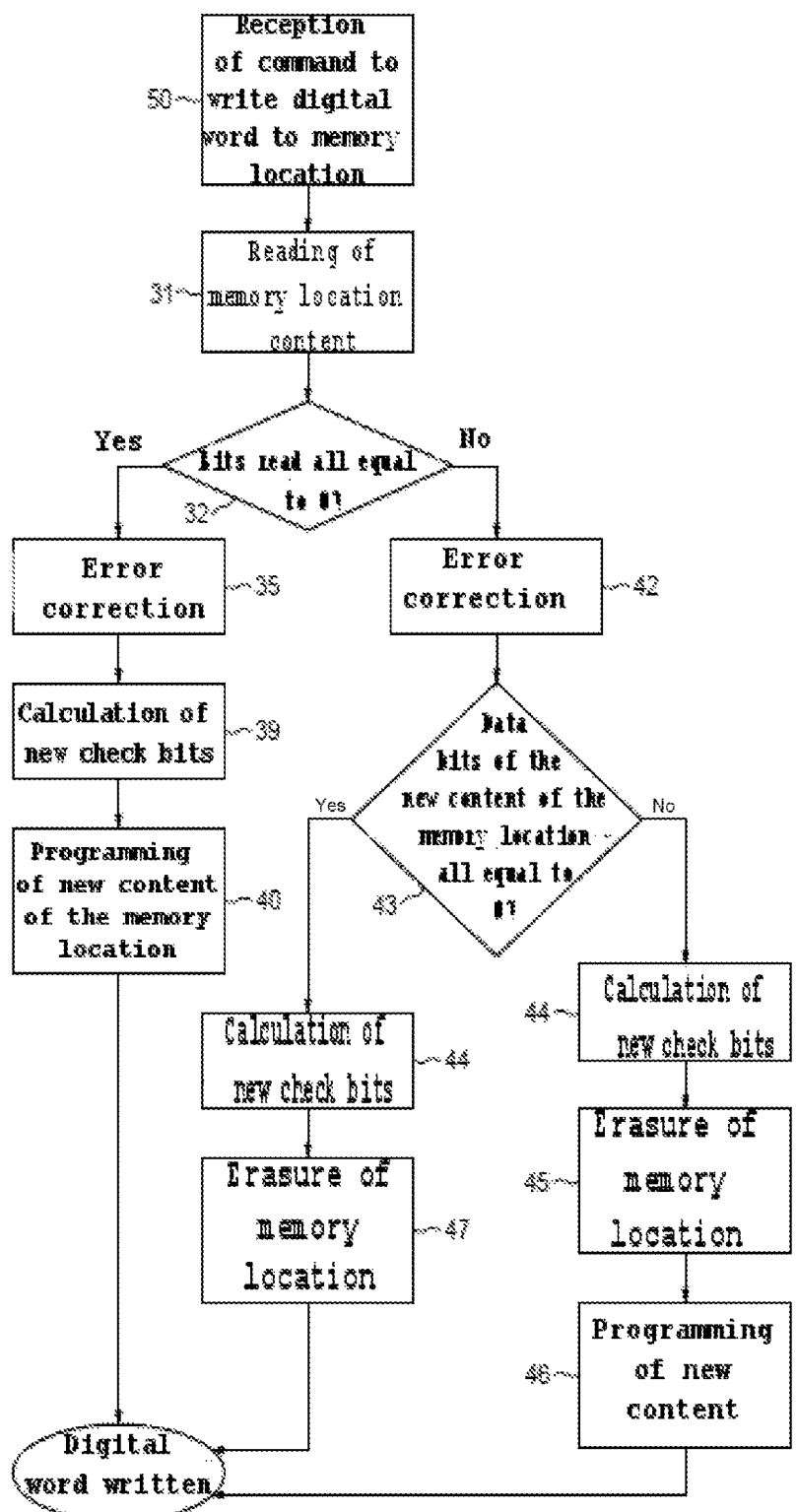

In this case, as illustrated in FIG. 7, in response to a command to write a digital word to a memory location (step 50), steps analogous to steps 31 and 32 of FIG. 5 are implemented.

If the response to the interrogation of step 32 is "yes", steps analogous to steps 35, 39 and 40 of FIG. 5 are implemented to write the digital word.

If the response to the interrogation of step 32 is "no", steps analogous to steps 42 and 43 of FIG. 6 are implemented.

If the response to the interrogation of step 43 is "yes", steps analogous to steps 44 and 47 of FIG. 6 are implemented to write the digital word.

If the response to the interrogation of step 43 is "no", steps analogous to steps 44, 45 and 46 of FIG. 6 are implemented to write the digital word.

With the first and second modes of writing, it is therefore possible in certain cases to reduce the duration of the write cycle and consequently the consumption of such a cycle by a factor of possibly as much as two and/or to improve the endurance of the product.

Figure 8:
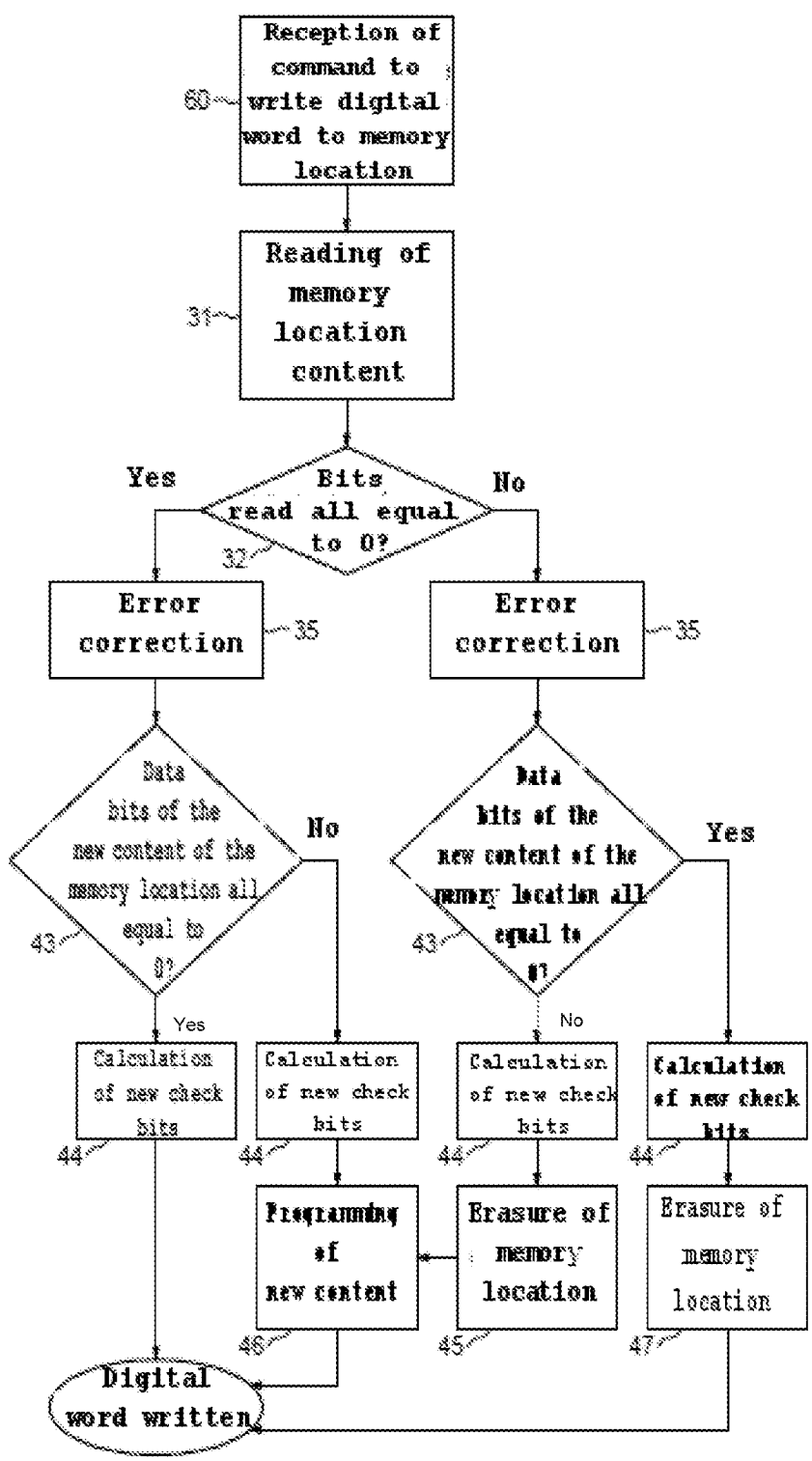

It is also possible to define, as illustrated in the left part of FIG. 8, a third mode of writing in which, in response to a command to write a digital word to a memory location (step 60), steps analogous to steps 31 and 32 of FIG. 5 are implemented.

If the response to the interrogation of step 32 is "yes", steps analogous to steps 35 of FIG. 5 and 43 of FIG. 6 are implemented.

If the response to the interrogation of step 43 is "yes", then the control circuitry MCM disables, after optionally having implemented a step analogous to step 44 of FIG. 6, the erasure and programming steps, and the digital word is considered to have been written.

Indeed in this third mode, it was desired to write "0"s to a memory location already containing "0"s.

In this case, if the programming step is actually disabled, so circumventing the generation of the programming pulse, the duration and the consumption of the write cycle are zero or quasi-zero.

If on the other hand the response to the interrogation of step 43 is "no", a step analogous to step 44 of FIG. 6 and then a step analogous to step 46 of FIG. 6 are implemented to write the digital word.

This third mode of writing can also be combined with the first and second modes of writing as illustrated in the right part of FIG. 8.

More precisely, if the response to the interrogation of step 32 is "no", steps analogous to steps 35 of FIG. 5 and 43 of FIG. 6 are implemented.

If the response to the interrogation of step 43 is "yes", steps analogous to steps 44 and 47 of FIG. 6 are implemented to write the digital word.

If the response to the interrogation of step 43 is "no", steps analogous to steps 44, 45 and 46 of FIG. 6 are implemented to write the digital word.

Of course the first, second and third controllers functionally intended respectively to implement the first, second and third modes of writing can be grouped together hardware-wise within the control circuitry MCM.

When the memory is intended to be written page-wise, the erasure pulse makes it possible for the whole of the content of the page to be erased globally.

Likewise, the programming pulse makes it possible for all the memory cells of the page to be programmed selectively and simultaneously.

In a general manner, before the generation of an erasure and/or programming pulse or the possible absence of generation of such pulses for the writing of the page, the control circuitry will, for each memory location of the page, detect the possible necessary operation or operations to write the new content of the memory location considered, including the new digital word and the new check bits, and then apply the worst case in respect of the writing of the page.

Figure 9:
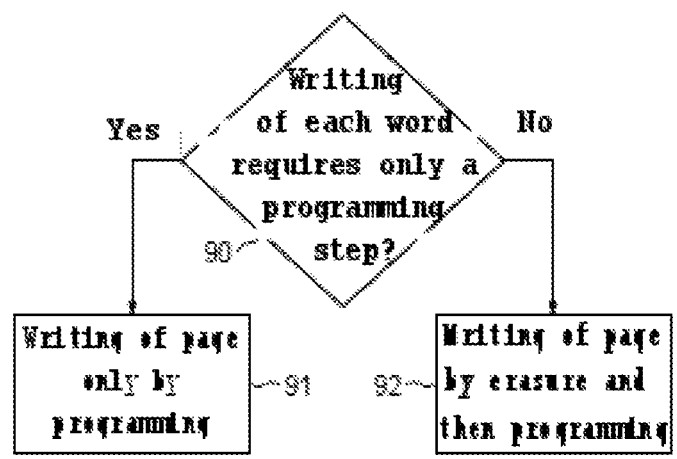

Thus as illustrated in FIG. 9, which is the counterpart of FIG. 5, there is proposed a first mode of page writing implemented within the memory device by fourth controller incorporated into the control circuitry MCM and providing for a test 90 to determine whether the writing of each memory location of the page requires only a programming step.

In the affirmative the writing of the page is performed by a programming step 91 only.

In the converse case, the writing 92 of the page is performed conventionally by erasure and then programming.

Figure 10:
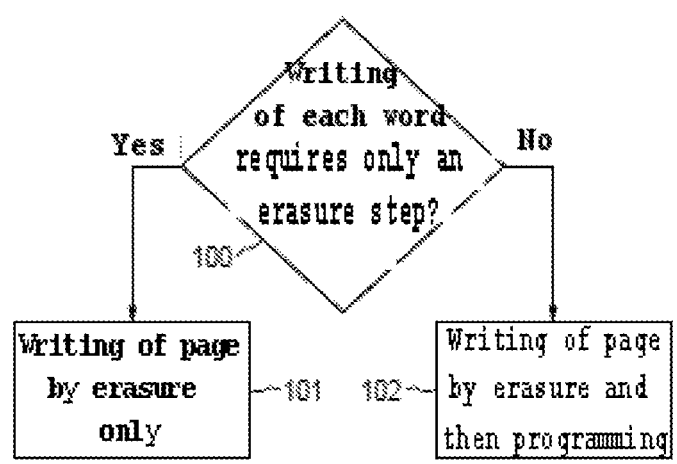

As illustrated in FIG. 10 which is the counterpart of FIG. 6 there is proposed a second mode of page writing implemented within the memory device by fifth controller incorporated into the control circuitry MCM and providing for a test 100 to determine whether the writing of each memory location of the page requires only an erasure step.

In the affirmative the writing of the page is performed by an erasure step 101 only.

In the converse case, the writing 102 of the page is performed conventionally by erasure and then programming.

Figure 11:
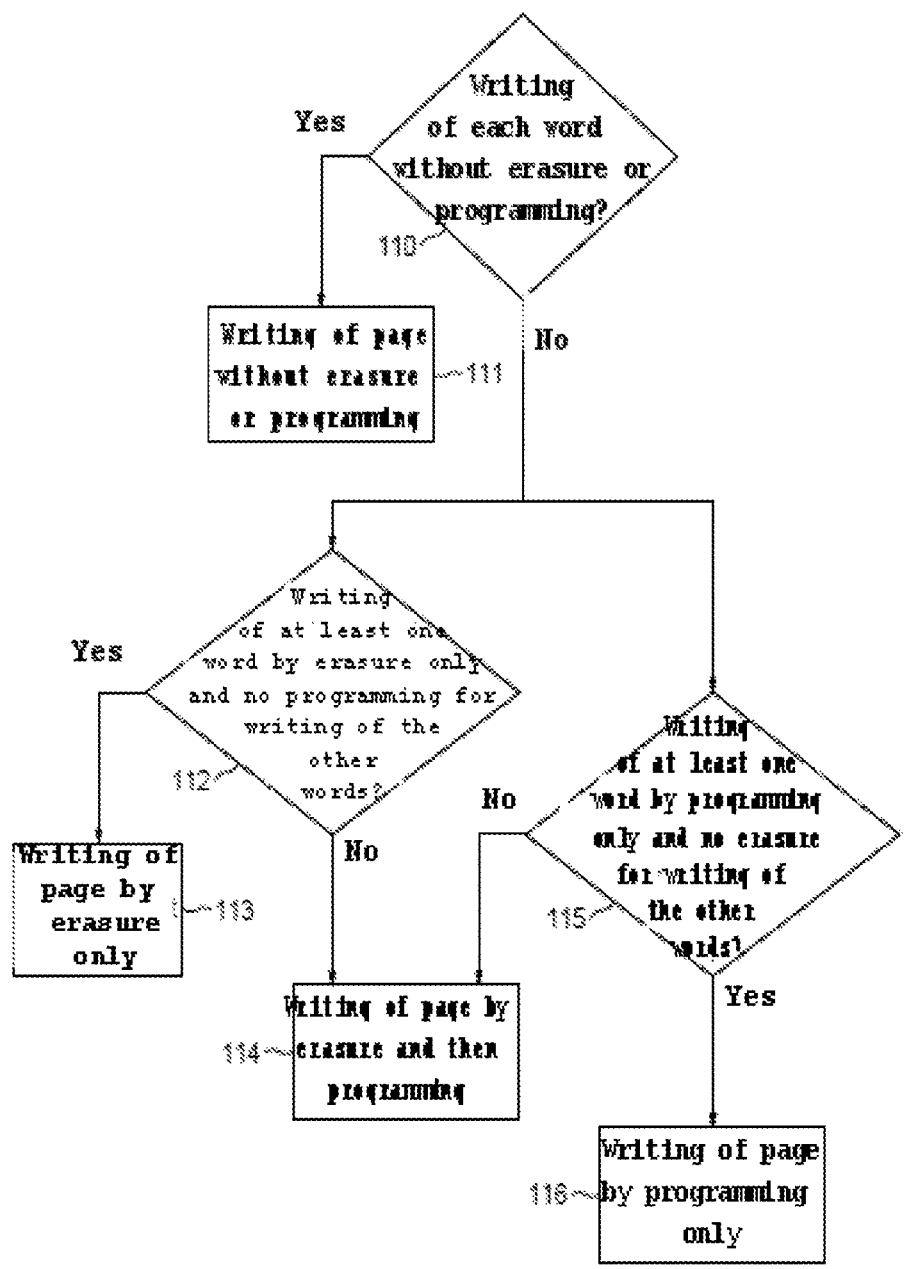

The part of FIG. 11 comprising steps 110 and 111 is the counterpart of the left part of FIG. 8, and illustrates a third mode of page writing implemented within the memory device by sixth controller incorporated into the control circuitry MCM and providing for a test 110 to determine whether the writing of each memory location of the page requires neither erasure step nor programming step.

In the affirmative the writing 111 of the page is performed without erasure or programming.

The first mode of page writing, the second mode of page writing and the third mode of page writing can be combined, as illustrated in the remainder of FIG. 11.

In this case the writing of the digital words of the page requires only an erasure step 113 if the writing of at least one digital word requires only an erasure step and if the writing of no other digital word requires a programming step (test 112), requires only a programming step 116 if the writing of at least one digital word requires only a programming step and if the writing of no other digital word requires an erasure step (test 115), and requires (step 114) a conventional succession of an erasure step and of a programming step in all other cases.

The write command triggering the first mode of writing and/or the second mode of writing and/or the third mode of writing and/or the first mode of page writing and/or the second mode of page writing and/or the third mode of page writing can be a conventional write command or else a specific command.

The first mode of writing and/or the second mode of writing and/or the third mode of writing and/or the first mode of page writing and/or the second mode of page writing and/or the third mode of page writing can be implemented by default within the memory device, or else be activatable.

Several non-limiting possibilities exist for undertaking this activation.

It is for example possible to use a volatile or non-volatile bit, programmable by the user, for example a bit of the status word present in the status register SRG of the memory and accessible through a bus of SPI type.

It is also possible to use a new specific write command.

The invention is particularly useful during the initial writing of the entirety of the memory plane, for example when this memory plane has to be written entirely with 0s.

That being so, the invention also applies when the user wishes that the memory plane, in the user's view, be considered to be written initially with 1's. Indeed in this case it suffices to provide for a data inversion during the reading and programming steps so that a data item in the user's view is managed internally in the memory device like the complementary data item.

And a memory plane viewed by the user as initialized with 1s (FF) will in fact be processed internally as having to be written with 0s.

In the case where only a programming step is performed with no prior erasure step, the already erased bits cannot be refreshed in an erased state.

However, this case is not a problem since it implies that all the bits are properly read internally as being 0s. And if a bit is in error and appears internally to be a 1, the memory device would then execute a complete write cycle (erasure and programming), which would then refresh the bit considered in its erased state.

And if a user nonetheless wishes to force a refresh of the erased state, he can always do so by entering a 1 into the data to be written (or a 0 if a data inversion is provided for internally), and then by writing the same digital word again, which will then cause as explained hereinabove a complete write cycle (erasure and programming).

By construction an over-programming of the EEPROM memory cells may induce functional and reliability problems (leakage, endurance for example).

In conventional EEPROM memories, the erasure operation is global while the programming operation is selective and always follows an erasure operation. Therefore the memory cells can only be over-erased but never over-programmed.

The invention also avoids any over-programming of memory cells, since the presence of a programmed memory cell (containing a 1) will prohibit, during the next write cycle, as explained hereinabove, a write performed only with a programming step.

And this is particularly beneficial since the fact that the memory device automatically internally manages the step or steps implemented during the write cycle avoids any accidental over-programming caused by the user.

It is also not possible with the invention to have a memory word containing a single error and which would not be refreshed with a correct content. Indeed the implementation of a programming step with no prior erasure step implies that all the bits of the memory word are set to 0, and for a Hamming code, the fact that all the bits are set to 0 implies the absence of a single bit in error.

What is claimed is:

1. A method for writing to a memory, the method comprising:
receiving a first instruction to write a new content to a memory location of a memory plane of an electrically programmable and erasable read-only memory device, the memory location containing a current content;
comparing the current content with the new content to produce a comparison result;
determining a write operation type based on one or more of the comparison result, the new content and the current content; and
writing the new content to the memory location based on the write operation type, wherein writing the new content comprises:
when the write operation type corresponds to a first write type, writing the new content to the memory location by performing an erasure step without performing a programming step,
when the write operation type corresponds to a second write type, writing the new content to the memory location by performing the programming step without performing the erasure step,
when the write operation type corresponds to a third write type, writing the new content to the memory location by performing the erasure step and performing the programming step after performing the erasure step, and
when the write operation type corresponds to a fourth write type, writing the new content to the memory location without performing the erasure step and without performing the programming step.

2. The method according to claim 1, wherein determining the write operation type comprises determining that the write operation type correspond to the second write type or the fourth write type when the new content is bitwise greater than or equal to the current content.

3. The method according to claim 2, wherein determining the write operation type comprises determining that the write operation type corresponds to the fourth write type when the new content is bitwise equal to the current content.

4. The method according to claim 3, wherein the current content of the memory location is equal to 0.

5. The method according to claim 2, wherein, when the new content is bitwise greater than or equal to the current content and at least one bit of the new content is greater than a corresponding bit of the current content, writing the new content comprises selectively programming of each bit of the new content that is greater than the corresponding bit of the current content.

6. The method according to claim 5, wherein selectively programming comprises programming each bit for which the result of a logical AND function applied to each bit of the new content and to the opposite of the corresponding bit of the current content is equal to 1.

7. The method according to claim 1, further comprising:
determining whether the new content of the memory location is bitwise greater than or equal to the current content of the memory location by
performing a bitwise logical AND function between the new content of the memory location and a bitwise inverse of the current content of the memory location to produce a first intermediate set of bits,
bitwise inverting the first intermediate set of bits to produce a second intermediate set of bits, and
performing a logical AND function between the second intermediate set of bits to obtain a first logical value; and
avoiding performing the erasure step during a write operation when the first logical value is equal to 1.

8. The method according to claim 7, wherein avoiding performing the erasure step comprises avoiding generation of an erasure pulse or avoiding selection of the memory location of the memory location.

9. The method according to claim 8, wherein avoiding performing the erasure step comprises avoiding generation of an erasure pulse and avoiding selection of the memory location of the memory location.

10. The method according to claim 1, wherein performing the programming step comprises generating a programming pulse having a first voltage ramp followed by a first voltage plateau, and performing the erasure step comprises generating an erasure pulse having a second voltage ramp followed by a second voltage plateau, wherein the first voltage is equal to the second voltage.

11. A method for writing a digital word to a memory location of a memory plane of an electrically programmable and erasable read-only memory device that includes a Hamming code type error-correcting code mechanism, the digital word comprising a number of data bytes and the memory location being intended to contain a number of data bytes at least equal to the number of data bytes of the digital word together with check bits, the method comprising:
receiving a command to write the digital word;
in response to the command to write the digital word, performing a write operation, the write operation comprising:
reading a current content of the memory location;
calculating new check bits associated with the digital word;
comparing the current content with zero;
when the current content is equal to zero, writing the digital word and the new check bits to the memory location by performing a programming step without performing an erasure step; and
when the current content is different from zero, writing the digital word and the new check bits to the memory location by performing the erasure step and performing the programming step after performing the erasure step.

12. The method according to claim 11, wherein the digital word comprises a single data byte.

13. The method according to claim 11, wherein writing the digital word to the memory location of the memory plane comprises writing a plurality of digital words in a plurality of memory locations of the memory plane of the electrically programmable and erasable read-only memory device, the plurality of memory locations forming at least one page of the memory plane, and each digital word of the plurality of digital words comprising a number of data bytes and each memory location of the plurality of memory locations being intended to contain a number of data bytes at least equal to the number of data bytes of the digital word together with check bits.

14. The method according to claim 11, wherein performing a programming step with no prior erasure step comprises avoiding generation of an erasure pulse or avoiding selection of the memory location of the memory location.

15. The method according to claim 14, wherein performing a programming step with no prior erasure step comprises avoiding generation of an erasure pulse and avoiding selection of the memory location of the memory location.

16. The method according to claim 11, further comprising:
comparing the digital word with zero; and
when the current content is equal to zero and the digital word is equal to zero, the write operation comprises writing the digital word to the memory location without performing the erasure step and without performing the programming step;
when the current content is different from zero and the digital word is equal to zero, the write operation comprises writing the digital word to the memory location by the erasure step and without performing the programming step.

17. A method for writing a digital word to a memory location of a memory plane of an electrically programmable and erasable read-only memory device that includes a Hamming code type error-correcting code mechanism, the digital word comprising a number of data bytes and the memory location being intended to contain a number of data bytes at least equal to the number of data bytes of the digital word together with check bits, the method comprising:
receiving a command to write the digital word;
in response to the command to write the digital word, performing a write operation, the write operation comprising:
calculating new check bits associated with the digital word;
comparing the digital word with zero;
when the digital word is equal to zero, writing the digital word and the new check bits to the memory location by performing an erasure step without performing a programming step; and
when the digital word is different from zero, writing the digital word and the new check bits to the memory location by performing the erasure step and performing the programming step after performing the erasure step.

18. The method according to claim 17, wherein writing the digital word to the memory location of the memory plane comprises writing a plurality of digital words in a plurality of memory locations of the memory plane of the electrically programmable and erasable read-only memory device, the plurality of memory locations forming at least one page of the memory plane, and each digital word of the plurality of digital words comprising at least one data byte and each memory location of the plurality of memory locations being intended to contain a number of data bytes at least equal to the number of data bytes of the digital word together with check bits.

19. The method according to claim 17, wherein the digital word comprises a plurality of data bytes and the write operation further comprises reading a current content of the memory location prior to the calculating.

20. The method according to claim 17, wherein calculating new check bits associated with the digital word comprises calculating new check bits associated with the digital word after comparing the digital word with zero.

21. A method for writing a digital word to a memory location of a memory plane of an electrically programmable and erasable read-only memory device that includes a Hamming code type error-correcting code mechanism, the digital word comprising a number of data bytes and the memory location being intended to contain a number of data bytes at least equal to the number of data bytes of the digital word together with check bits, the method comprising:
receiving a command to write the digital word;
in response to the command to write the digital word, performing a write operation, the write operation comprising:
reading a current content of the memory location;
comparing the current content with the digital word;

when the current content is different from the digital word, writing the digital word to the memory location by performing an erasure step and performing a programming step after performing the erasure step; and when the current content is equal to the digital word, writing the digital word to the memory location without performing the erasure step and without performing the programming step.

22. The method according to claim 21, wherein writing the digital word to the memory location of the memory plane comprises writing a plurality of digital words in a plurality of memory locations of the memory plane of the electrically programmable and erasable read-only memory device, the plurality of memory locations forming at least one page of the memory plane, and each digital word of the plurality of words comprising at least one data byte and each memory location of the plurality of memory locations being intended to contain a number of data bytes at least equal to the number of data bytes of the digital word together with check bits.

23. A method for writing a plurality of digital words in a plurality of memory locations of a memory plane of an electrically programmable and erasable read-only memory device that includes a Hamming code type error-correcting code mechanism, the plurality of memory locations forming at least one page of the memory plane, each digital word comprising a number of data bytes and each memory location being intended to contain a number of data bytes at least equal to the number of data bytes of the digital word together with check bits, the method comprising:

receiving a command to write the digital word; and in response to the command to write the digital word, performing a write operation, wherein the write operation comprises:

reading each current content of the plurality of memory locations, each current content corresponding to respective digital word of the plurality of digital words;

when each digital word is equal to zero, performing an erasure step without performing a programming step after the erasure step; and when each digital word is bitwise greater or equal to the corresponding current content, performing a programming step without performing an erasure step.

* * * * *